United States Patent [19]

Khorramabadi et al.

[11] Patent Number: 5,532,471

[45] Date of Patent: Jul. 2, 1996

[54] OPTICAL TRANSIMPEDANCE AMPLIFIER WITH HIGH DYNAMIC RANGE

[75] Inventors: Haideh Khorramabadi, Chatham Township, Morris County; Maurice J. Tarsia, Colonia, both of N.J.; Liang D. Tzeng, Fogelsville, Pa.

[73] Assignee: AT&T Corp., Murray Hill, N.J.

[21] Appl. No.: 360,895

[22] Filed: Dec. 21, 1994

[51] Int. Cl.⁶ ..................................... H01J 40/14
[52] U.S. Cl. .................. 250/214 A; 330/283; 330/284; 327/312; 327/483; 327/205; 359/194
[58] Field of Search .................. 250/214 A, 214 R, 250/214.1, 551; 330/283, 284, 59, 308; 359/194; 327/483, 312, 205, 206, 560, 562, 379

[56] References Cited

U.S. PATENT DOCUMENTS

| | | | |
|---|---|---|---|
| 4,540,952 | 9/1985 | Williams | 330/279 |
| 4,564,818 | 1/1986 | Jones | 330/311 |
| 4,609,880 | 9/1986 | Dermitzakis et al. | 330/308 |
| 4,792,998 | 12/1988 | Toussaint | 455/619 |
| 4,914,402 | 4/1990 | Dermitzakis et al. | 330/308 |
| 5,363,064 | 11/1994 | Mikamura | 330/308 |
| 5,382,920 | 1/1995 | Jung | 330/308 |

OTHER PUBLICATIONS

Robert J. Bayruns et al., "Monolithic GaAs Transimpedance Amplifiers for Fiber–Optic Receivers", IEEE Journal of Solid State Circuits, vol. 26, No. 12, Dec. 1991, pp. 1834–1839.

Primary Examiner—Edward P. Westin
Assistant Examiner—Stephen Calogero

[57] ABSTRACT

A preamplifier for use with currents developed by a photodetecting diode is disclosed wherein the currents are coupled to the base of an NPN transistor connected as a common emitter stage and a feedback resistor is connected by way of a buffer amplifier to the base to provide a standard transimpedance configuration. A control loop monitors the signal level by integrating the output of the buffer amplifier, and upon the detection of large signals the control loop causes a MOSFET in parallel with the feedback resistor to decrease the transimpedance and thereby increase the signal handling capability of the preamplifier. The control loop is also connected to a second MOSFET in parallel with the collector load resistor of said NPN transistor to decrease the effective collector load impedance for large signal levels. A third MOSFET in parallel with a resistor in the emitter of the NPN transistor is also responsive to the signal level in order to increase the amount of resistance in the emitter circuit of said common amplifier stage for large signal levels.

6 Claims, 2 Drawing Sheets

OPTICAL TRANSIMPEDANCE AMPLIFIER WITH HIGH DYNAMIC RANGE

FIELD OF THE INVENTION

This invention relates to preamplifiers used in optical data link receiver front-ends that have high sensitivity and wide dynamic range. More particularly, this invention relates to optical preamplifiers that use an adaptive transimpedance scheme to provide a means of widening the dynamic range without sacrificing sensitivity.

DESCRIPTION OF THE RELATED ART

Optical preamplifiers in the prior art typically use a bipolar transimpedance amplifier. A PIN photodetector typically delivers its output current to the base of a bipolar transistor connected as a common emitter gain stage followed by a buffer amplifier. The output of the buffer amplifier is connected back to the base electrode of the common emitter stage through a feedback resistor, $R_F$, to form the configuration known in the art as a bipolar transimpedance amplifier. From the point of view of sensitivity, a high value of $R_F$ is desired. On the other hand, in order to accommodate large signals, that is to provide a large dynamic range, a low value for $R_F$ is desired since the maximum input current handling capability is limited to $V_{MAX}/R_F$ where $V_{MAX}$ is the maximum voltage swing permitted before encountering clipping. Due to the above considerations, a compromise value was typically chosen for $R_F$ resulting in a non-optimum sensitivity and dynamic range.

One optical preamplifier in the prior art which solves this problem to a degree is shown in FIG. 2. The circuit of FIG. 2 was disclosed as FIG. 9 in the article entitled "Monolithic GaAs Transimpedance Amplifiers for Fiber-Optic Receivers" by N. Scheinberg et al., pages 1834–1839, IEEE Journal of Solid-State Circuits, Vol. 26, No. 12, December 1991. To maintain sensitivity while increasing the dynamic range, the circuit of FIG. 2 uses an automatic control circuit (AGC) which is implemented by connecting an FET in parallel with the feedback resistor $R_F$ to provide an adaptive transimpedance amplifier. The gate of the FET is connected to receive the average value of the output. As illustrated in FIG. 10 of the Scheinberg et al. article, the AGC circuit improves the dynamic range of the amplifier and the frequency response remains stable up to an input current as large as 0.5 mA. (milliamperes).

SUMMARY OF THE INVENTION

An even further increase in the dynamic range of an optical adaptive transimpedance preamplifier is provided in accordance with the present invention wherein the input of the optical preamplifier is a bipolar junction transistor (BJT) connected in a common emitter stage wherein the collector load resistor has a metal oxide field effect transistor (MOSFET) connected in parallel with the resistor. the gate of the MOSFET is driven by a voltage whose value is dependent on the output signal level such that the effective collector load impedance is lowered as the output signal level increases in much the same way that the feedback resistor is decreased. As a result, the collector load impedance is caused to track the feedback impedance in a way such that frequency response stability is maintained with even higher input signal levels.

The dynamic range is increased even further in accordance with an aspect of the present invention wherein the common emitter amplifier is provided with a second MOSFET connected in parallel with a resistor connected between the emitter of the BJT and ground. The voltage provided to the gate of this second MOSFET and the MOSFET type is chosen such that the emitter resistance is completely bypassed by the MOSFET for low signal levels, thereby permitting high amplification, but is permitted to increase in value for increased signal levels. As a result, the open-loop gain of the preamplifier is decreased for larger signal levels thereby permitting a higher collector resistor and higher sensitivity. In addition, the maximum input voltage swing is also increased.

DESCRIPTION OF THE PREFERRED EMBODIMENT

Figure 2:
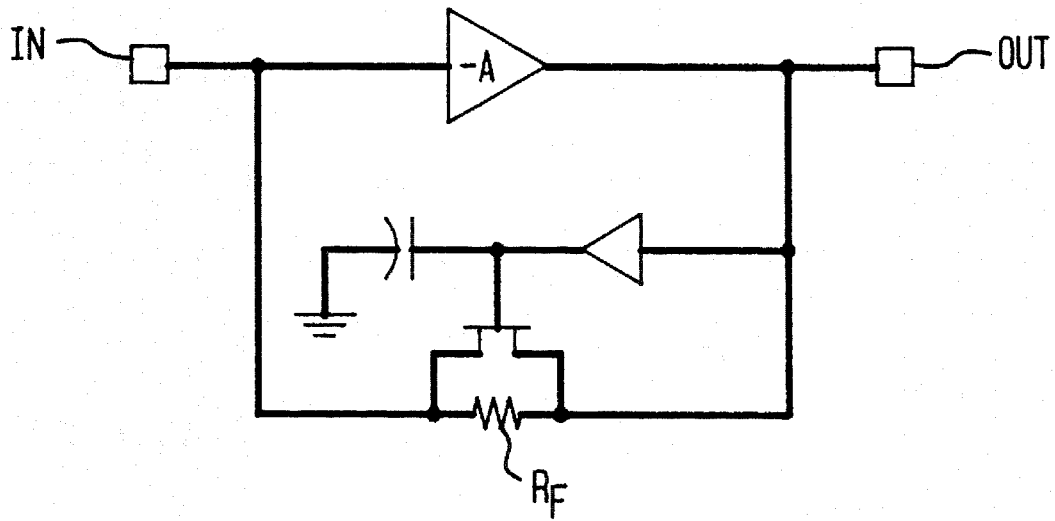
FIG. 2 is a schematic diagram of a prior art optical preamplier.

As pointed out hereinbefore, FIG. 2 shows a schematic diagram of a prior art optical transimpedance preamplifier circuit which increases the dynamic range by placing an FET in parallel with the feedback resistor. The gate of the FET is fed by a voltage representing the average value of the output. As the input increases from 0.001 mA. to 0.5 mA., the transimpedance decreases as shown in FIG. 10 of the Scheinberg et al. article.

Figure 3:
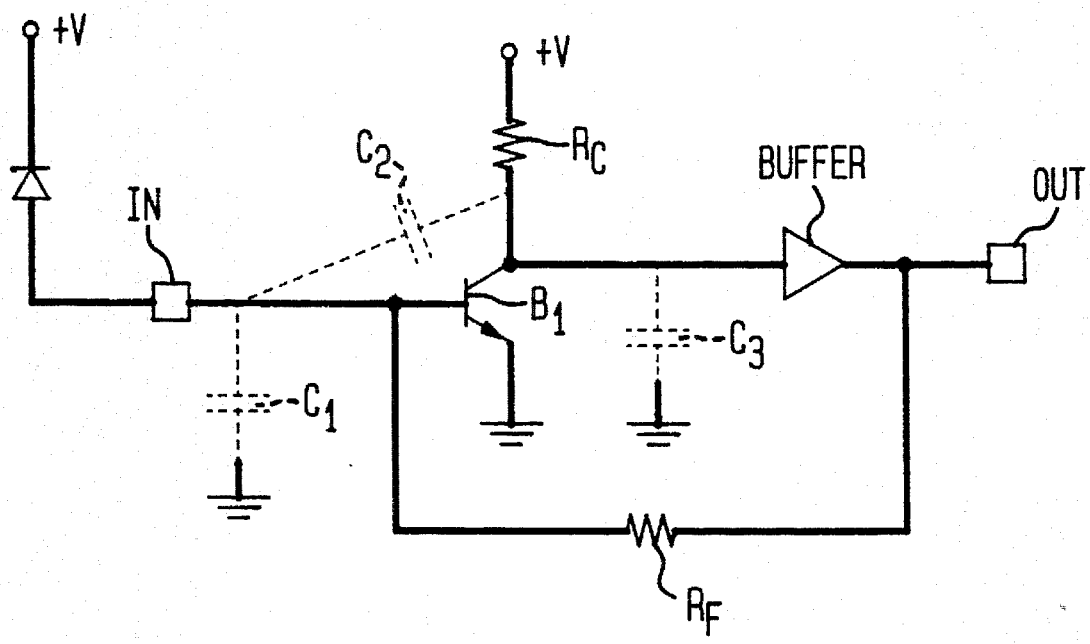
FIG. 3 is a schematic diagram useful in explaining the operation of the present invention.

One problem in expanding the concept set forth in the above-identified article by Scheinberg et al. is that of maintaining stability. This problem can best be discussed by referring to FIG. 3 wherein the schematic diagram of a transimpedance type amplifier is shown along with the major parasitic capacitances which affect the frequency response of the amplifier. In FIG. 3, a bipolar junction transistor B1 is connected in a common emitter configuration with its emitter connected to ground and its collector connected both through a collector load resistor $R_C$ to a potential source V and to the input of a buffer amplifier. The output of the buffer amplifier is connected through a feedback resistor $R_F$ to the base electrode of the transistor to form a transimpedance amplifier. The dominant pole, p1, which determines the frequency bandwidth of this amplifier can be represented by the following equation:

$$p1 \approx \frac{a}{C_1 \times R_F}$$

where a depicts the open-loop voltage gain of the amplifier, $C_1$ is the parasitic capacitance associated with the photodetector, base-emitter junction of B1, and the interconnect capacitance. Assuming that the parasitic capacitance $C_2$ between the base and collector electrodes is negligible, the second pole can be represented by the following equation:

$$p2 \approx \frac{1}{C_3 \times R_C}$$

where $R_C$ is the collector load resistor, and $C_3$ is the parasitic capacitance between the collector electrode of B1 and ground including the input capacitance of the buffer amplifier. In order to maintain a well behaved frequency response that is fairly flat out to the −3 db point, it is necessary to maintain a phase margin in excess of 60° which in turn dictates a ratio for the dominant poles given by the following relationship:

$$\frac{P2}{P1} > 2.75$$

Substituting the parameters given for the poles herein above, the following relationship is obtained for the value of the collector load resistor, $R_C$:

$$R_C < \frac{R_F \times C_1}{2.75 \times a \times C_3}$$

The latter equation suggests that $R_F$ can be lowered even further than was permitted in the prior art circuits and stability in the frequency response can still be maintained providing that $R_C$ is also lowered in value with decreases in the value of $R_F$.

Figure 1:
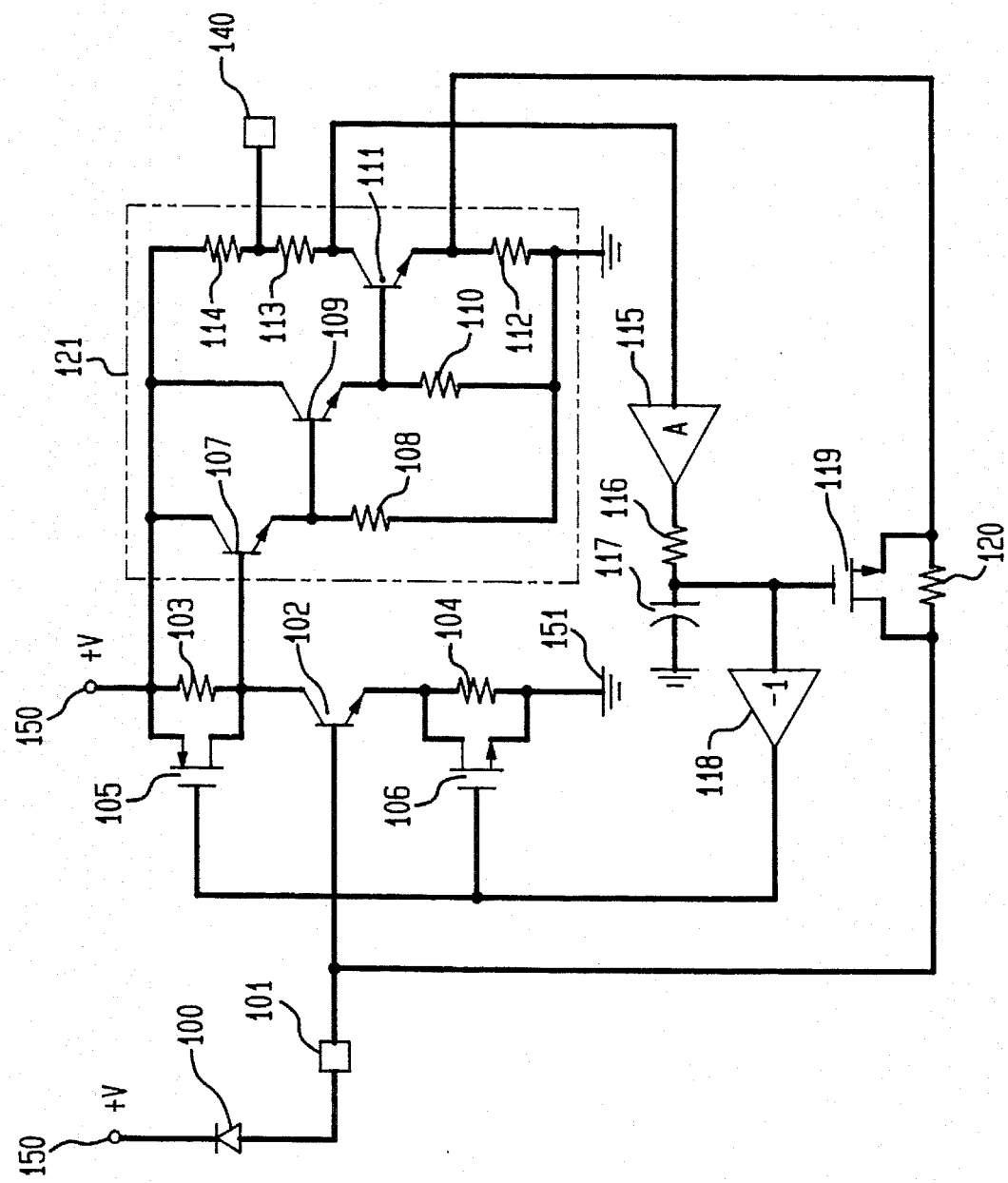
FIG. 1 is a schematic diagram of an optical preamplifier constructed in accordance with the present invention.

An optical preamplifier circuit which achieves this stability in the frequency response with even lower values of $R_F$ than was permitted in the prior art is shown in FIG. 1. In FIG. 1, a photodetecting diode 100 is back-biased by a positive potential source 150 connected to its cathode electrode, and the currents developed by the diode by radiation impinging on the diode are coupled from the anode of the diode to an input terminal 101 of the FIG. 1 optical preamplifier. The currents from input terminal 101 are coupled to the base electrode of an NPN transistor 102 which is connected as a common emitter stage with its collector electrode connected through a resistor 103 to a positive potential source 150, +V, and its emitter connected through a resistor 104 to ground potential 151. A p-channel metal oxide field effect transistor (MOSFET) 105 is connected in parallel with resistor 103 with the source electrode connected to positive potential source 150 and its drain electrode connected to the collector of transistor 102. Similarly, an n-channel MOSFET 106 is connected in parallel with resistor 104 with its source electrode connected to ground potential 151 and its drain electrode connected to the emitter electrode of transistor 102.

The gate electrodes of MOSFETs 105 and 106 are connected together and biased in a manner to be described hereinafter with a potential having a value which is dependent on the input signal level. At very low input signal levels, the gates are biased with a potential of about +5 volts causing MOSFET 106 to be completely turned on and to thereby short the emitter of transistor 102 to ground potential. The +5 volts on the gate of MOSFET 105 on the other hand causes it to be completely turned off and the full value of resistor 103 appears as the collector load, $R_C$. As input signal levels increase, the potential on the gates is decreased causing MOSFET 105 to be turned on and thereby decrease the effective value of the collector load, $R_C$, and causing MOSFET 106 to be driven towards off thereby permitting an effective value of emitter resistance, $R_E$, to be present in the common emitter stage using transistor 102.

The signal at the collector of transistor 102 is coupled to a buffer amplifier 121 consisting of transistors 107, 109 and 111. Transistors 107 and 109 are connected as emitter followers with their respective collectors connected to positive potential source 150 and their emitters connected through resistors 108 and 110 respectively through to ground potential 151. As a result, the signal at the collector of transistor 102 is coupled to the base of transistor 111 after encountering a dc potential drop equal to two base-to-emitter potential drops of about (2×0.85=) 1.70 volts. The use of the emitter followers advantageously permits the first transistor to be fabricated with a small emitter area such that it does not add significantly to the parasitic capacitance identified hereinabove as C2. The second emitter follower with transistor 109 can be fabricated with a larger emitter area in order to increase the amount of power capable of being delivered to the output stage of the buffer amplifier 121 using transistor 111.

Transistor 111 is connected as a common emitter amplifier stage with its emitter connected through resistor 112 to ground potential and its collector connected through the series combination of resistors 113 and 114 to positive potential source 150. Output terminal 140 is connected to the junction of reisistors 113 and 114. In the embodiment which was constructed, the output was taken at this point in order to provide a different dc level than the one which is present at the collector of transistor 111. In should be apparent to those skilled in the art however, that the output could also be taken from the collector of transistor 111 and under these circumstances only one resistor need be present between the collector of transistor 111 and positive potential source 150.

The signal at the emitter of transistor 111 is coupled through feedback resistor 120 to the base of transistor 102 to provide negative feedback in a standard transimpedance amplifier configuration. An n-channel MOSFET 119 is connected in parallel with feedback resistor 120 with its source connected to the emitter of transistor 111 and its drain connected to the base of transistor 102. Accordingly, a potential can be applied to the gate of MOSFET 120 in a manner to be described hereinafter in order to regulate the amount of negative feedback.

The signal at the collector of transistor 111 is coupled to the input of a noninverting amplifier 115 whose output is connected to an integration circuit consisting of resistor 116 and capacitor 117. Accordingly, bursts of optical energy impinging on photodetecting diode 100 cause the resulting positive pulses on the collector of transistor 111 to be integrated and thereby develop a positive dc potential on capacitor 117. The value of positive potential on capacitor 117 is of course dependent on the strength of the optical signal with stronger optical signals causing a larger dc potential. The dc potential on capacitor 117 is applied to the gate of n-channel MOSFET 119. As a result, stronger optical signals cause MOSFET 119 to decrease the amount of feedback resistance, $R_F$, thereby decreasing the amplification of the preamplifier to accommodate the stronger optical signals.

The voltage across capacitor 117 is also coupled to the input of an amplifier 118 whose output is connected to the gates of MOSFETs 105 and 106. Amplifier 118 simply inverts the potentials available on capacitor 117. With low optical signal levels and a near zero voltage on capacitor 117, amplifier 118 presents a potential of about +5 volts to the gates of MOSFETs 106 and 107. Under this condition, resistor 104 is completely shorted out and resistor 103 is fully in the circuit resulting in maximum amplification in the preamplifier of FIG. 1. As the potential on capacitor 117 increases with stronger optical signals, the potential at the output of amplifier 118 decreases towards zero thereby decreasing the value of $R_C$, and permitting $R_C$ to track the decreases in the feedback resistance, $R_F$, in accordance with the above relationship. As a result, the ratio of the poles, p2/p1, can be kept more than 2.75 and stability maintained for even greater decreases in the feedback resistance than in the prior art.

The presence of MOSFET 106 permits the dynamic range to be widened even further. As pointed out hereinabove, for small signal levels MOSFET 106 completely shorts out the emitter resistor 104 and the open loop gain is not affected. In the large signal mode, MOSFET 106 operates in the off mode resulting in the introduction of resistance, $R_E$, in the emitter of transistor 102. The inclusion of MOSFET 106 and resistor 104 serves several purposes. First, in the large signal mode, it reduces the open-loop gain, a, of the preamplifier thereby limiting the increase in the frequency of the first pole, p1, due to the reduction of $R_F$. This in turn allows a higher effective value for $R_C$. The required size for MOSFET 105 and thus the over all value of the parasitic capacitance C3 is reduced resulting in higher values for $R_C$ in the small signal mode allowing superior sensitivity. Second, the introduction of $R_E$ in the large signal mode further expands the large signal handling capability. This is due to the fact that the maximum voltage swing of the preamplifier is increased from $V_{be}$ in the small signal mode, to $(V_{be}+R_E*I_C)$ for large signals.

The choice of component values in the input stage is critical in achieving high sensitivity. The principle noise sources are thermal noise due to the feedback resistor, shot noise associated with the base and collector currents of the input transistor, and finally thermal noise contributed by the base resistor. From consideration of the input referred noise, it can be determined that $R_F$ and $R_C$ must be chosen to be as large as possible while the base resistance of transistor 102 should be minimized. As will be appreciated by those skilled in the art, the relationships set forth hereinabove can be used in order to maximum sensitivity for a given bandwidth. For example, the base resistance can be minimized by making the emitter area of transistor 102 larger. Unfortunately, this will increase the parasitic capacitance C1, and thereby require a decrease in $R_F$ in order to keep the pole p1 in the same location.

For the embodiment which was constructed, the transimpedance begins decreasing at an average input photo current of about 0.01 mA. and continues to decrease up to about 1 mA. The embodiment was fabricated in a 1 μm, 20 GHz BiCMOS technology. The frequency bandwidth of about 600 MHz remained well behaved over a broad range of input currents ranging from 1 μA through to 600 μA. The transimpedance changes by a factor of 25 from small signals to large signals.

What is claimed is:

1. A preamplifier for use with currents developed by a photodetecting diode, said preamplifier comprising a bipolar junction transistor having an emitter, base and collector electrodes, means for coupling the currents developed by said photodetecting diode to said base electrode, means for connecting said emitter electrode to a ground potential, collector load means for connecting a source of potential to said collector electrode, buffer amplifier means responsive to voltage signals at said collector electrode for providing an output connection for said preamplifier, for coupling a negative feedback signal to said base electrode, and for developing a potential whose value represents the signal level of said voltage signals, the value of said feedback signal being dependent on said signal level, characterized in that said preamplifier further includes a means responsive to said potential whose value represents the signal level of said voltage signals for changing the effective impedance value of said collector load, said means for connecting said emitter electrode to ground potential is an emitter resistor, and a means responsive to said potential whose value represents the signal level of said voltage signals for changing the effective impedance value of said emitter resistor.

2. A preamplifier as defined in claim 1 wherein said means for changing the effective value of said emitter resistor includes a field effect transistor having a gate, source and drain electrodes, said source and drain electrodes of said field effect transistor being connected to opposite ends of said emitter resistor, and said gate electrode is connected to receive said potential whose value represents the signal level of said voltage signals.

3. A preamplifier for use with currents developed by a photodetecting diode, said preamplifier comprising a first bipolar junction transistor having an emitter, base and collector electrodes, means for coupling the currents developed by said photodetecting diode to said base electrode, means for connecting said emitter electrode to a ground potential, collector load means for connecting a source of potential to said collector electrode, buffer amplifier means responsive to voltage signals at said collector electrode for providing an output of said preamplifier, for coupling a negative feedback signal to said base electrode, and for developing a potential whose value represents the average signal level of said voltage signals, the value of said feedback signal being dependent on said average signal level, characterized in that said collector load means includes a collector resistor and a first field effect transistor of one channel type having a gate, source and drain electrodes, said source and drain electrodes being connected to opposite ends of said collector resistor, and means responsive to said potential whose value represents the average signal level for coupling a potential to said gate electrode, said means for connecting said emitter electrode to said ground potential includes an emitter resistor and a second field effect transistor having a gate, source and drain electrodes, said source and drain electrodes of said second field effect transistor being connected to opposite ends of said emitter resistor, and said gate electrode of said second field effect transistor is directly connected to the gate electrode of said first field effect transistor, said second field effect transistor being of opposite channel type to said first field effect transistor, whereby said first field effect transistor decreases the effective collector load resistance for increased values of said average signal level, and said second field effect transistor increases the effective resistance between said emitter and ground potential for increased values of said average signal level.

4. A preamplifier as defined in claim 3 wherein said buffer amplifier means responsive to said voltage signals at said collector electrode includes at least a second and third transistor connected as cascaded emitter follower stages with the second transistor having its base electrode connected directly to the collector electrode of said first transistor.

5. A preamplifier for use with currents developed by a photodetecting diode, said preamplifier comprising a first bipolar junction NPN transistor having an emitter, base and collector electrodes, means for coupling said developed currents to the base electrode of said NPN transistor, a collector resistor connected between said collector and a source of positive potential, means for connecting said emitter electrode to a ground potential, buffer amplifier means responsive to voltage signals at said collector electrode for providing an output of said preamplifier, for coupling a negative feedback signal to said base electrode, and for developing a potential which represents the average signal level present at said collector electrode, the value of said feedback signal being dependent on said average signal level, characterized in that said preamplifier includes a p-channel metal oxide field effect transistor (MOSFET) having a gate, source and drain electrodes, said source and drain electrodes of said MOSFET being connected in parallel with said collector resistor with the drain connected to the collector of said NPN transistor, and means responsive to the potential which represents said average signal level for providing said gate electrode with a potential, said means for connecting said emitter electrode to said ground potential includes an emitter resistor and an n-channel MOSFET having a gate, source and drain electrodes, said source and drain electrodes of said n-channel MOSFET being connected to opposite ends of said emitter resistor with the source connected to ground potential, and said gate electrode of said n-channel MOSFET is directly connected to the gate electrode of said p-channel MOSFET, whereby said p-channel MOSFET effectively decreases the collector resistance of said NPN for increased values of said average signal level, and said n-channel MOSFET increases the effective resistance between said emitter and ground potential for increased values of said average signal level.

6. A preamplifier as defined in claim 5 wherein said buffer amplifier means responsive to said voltage signals at said collector electrode includes at least second and third NPN transistors connected as cascaded emitter follower stages with the second NPN transistor having its base electrode connected directly to the collector electrode of said first NPN transistor.

* * * * *